US006618297B1

(12) United States Patent
Manea

(10) Patent No.: US 6,618,297 B1
(45) Date of Patent: Sep. 9, 2003

(54) METHOD OF ESTABLISHING REFERENCE LEVELS FOR SENSING MULTILEVEL MEMORY CELL STATES

(75) Inventor: Danut I. Manea, Cupertino, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/211,437

(22) Filed: Aug. 2, 2002

(51) Int. Cl.$^7$ .............................................. G11C 16/04
(52) U.S. Cl. .............................. 365/189.09; 365/185.03
(58) Field of Search .................. 365/189.09, 185.03, 365/185.21, 185.2, 185.19, 185.28, 185.29

(56) References Cited

U.S. PATENT DOCUMENTS

| 5,434,825 | A | | 7/1995 | Harari ......................... 365/185 |
| 6,044,019 | A | * | 3/2000 | Cernea et al. .......... 365/185.21 |
| 6,069,821 | A | * | 5/2000 | Jun et al. ................ 365/185.21 |
| 6,097,637 | A | | 8/2000 | Bauer et al. ............ 365/185.24 |
| 6,246,613 | B1 | | 6/2001 | Banks .................... 365/189.01 |
| 6,538,922 | B1 | * | 3/2003 | Khalid et al. .......... 365/185.03 |

* cited by examiner

*Primary Examiner*—Anh Phung
(74) *Attorney, Agent, or Firm*—Thomas Schneck; Mark Protsik

(57) ABSTRACT

In order to establish boundary current levels for more than two memory states, a circuit is provided that uses reference currents defining the center of each state. The reference currents are defined by multiple pre-programmed reference memory cells or by a single reference memory cell together with a current mirror that sets the other reference currents at specified proportions of a first reference current. With these reference currents, an analog circuit block generates fractional currents at (1−m) and m of the reference currents, where m is a specified margin value equal to 50% for read operations and less than 50% for program verify operations, then combines fractional currents for adjacent states to produce the boundary current levels. The fractional currents may be obtained with pairs of current mirrors biased by sense amplifiers for the various reference currents.

20 Claims, 5 Drawing Sheets

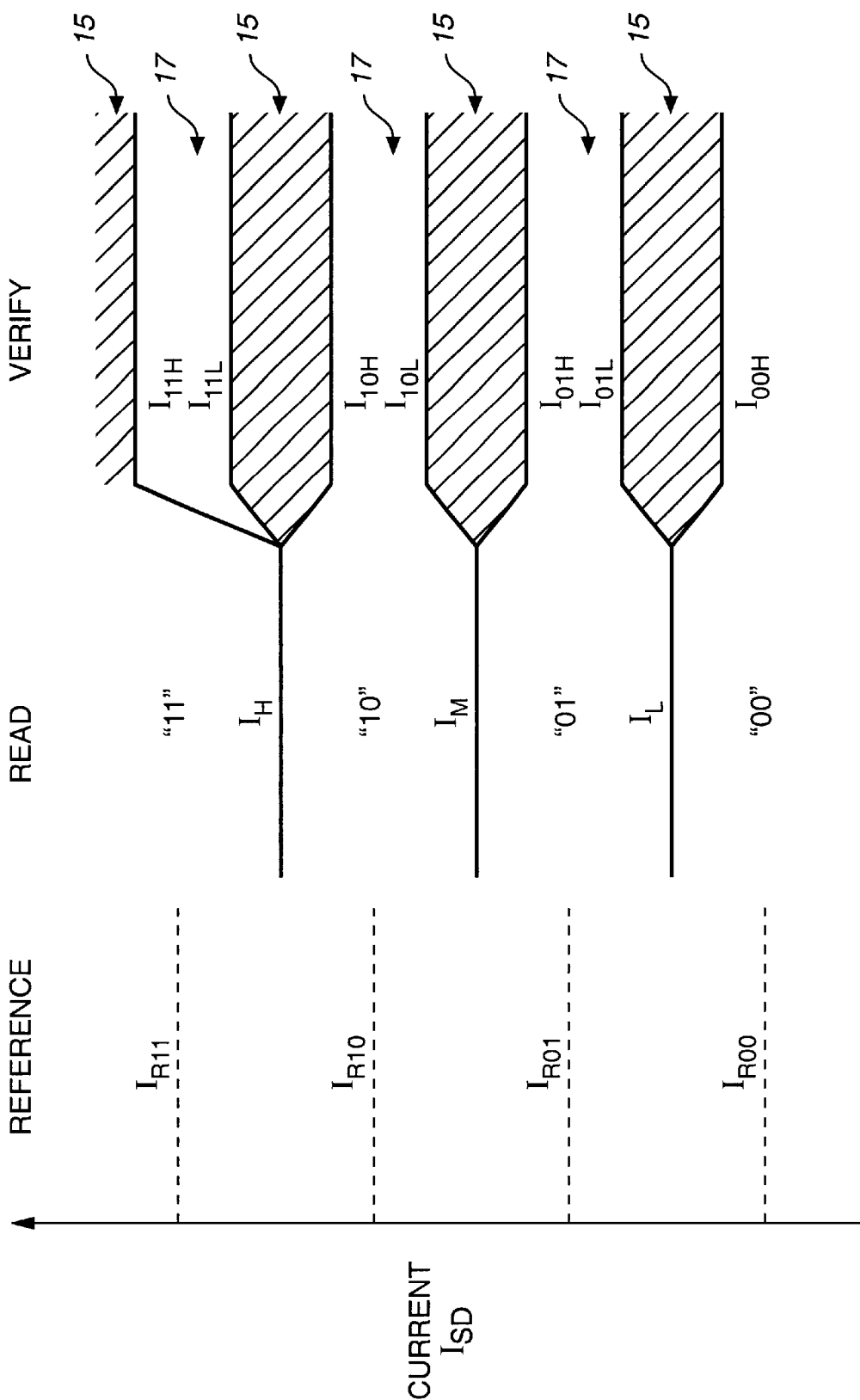
FIG._1

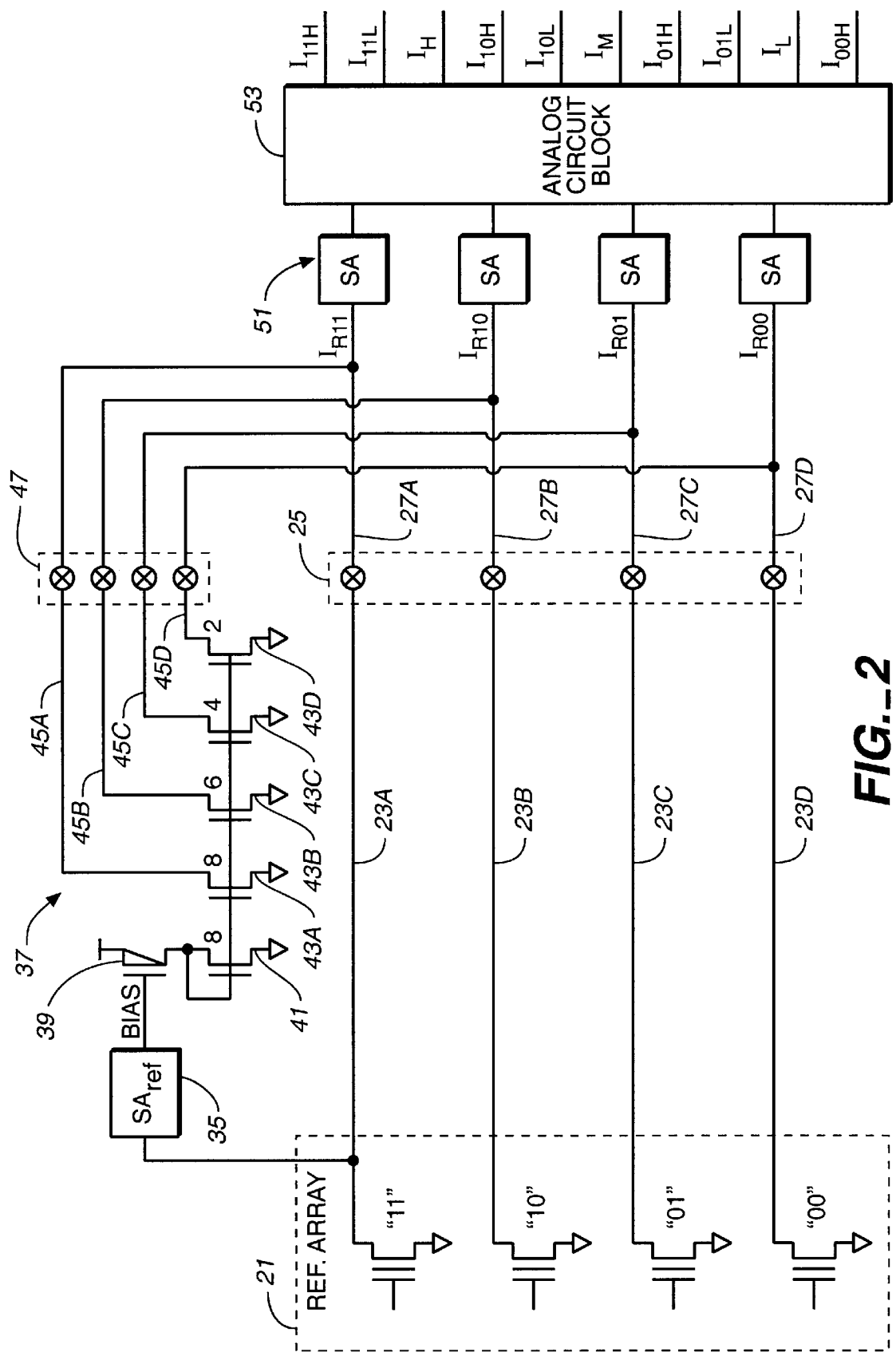
FIG._2

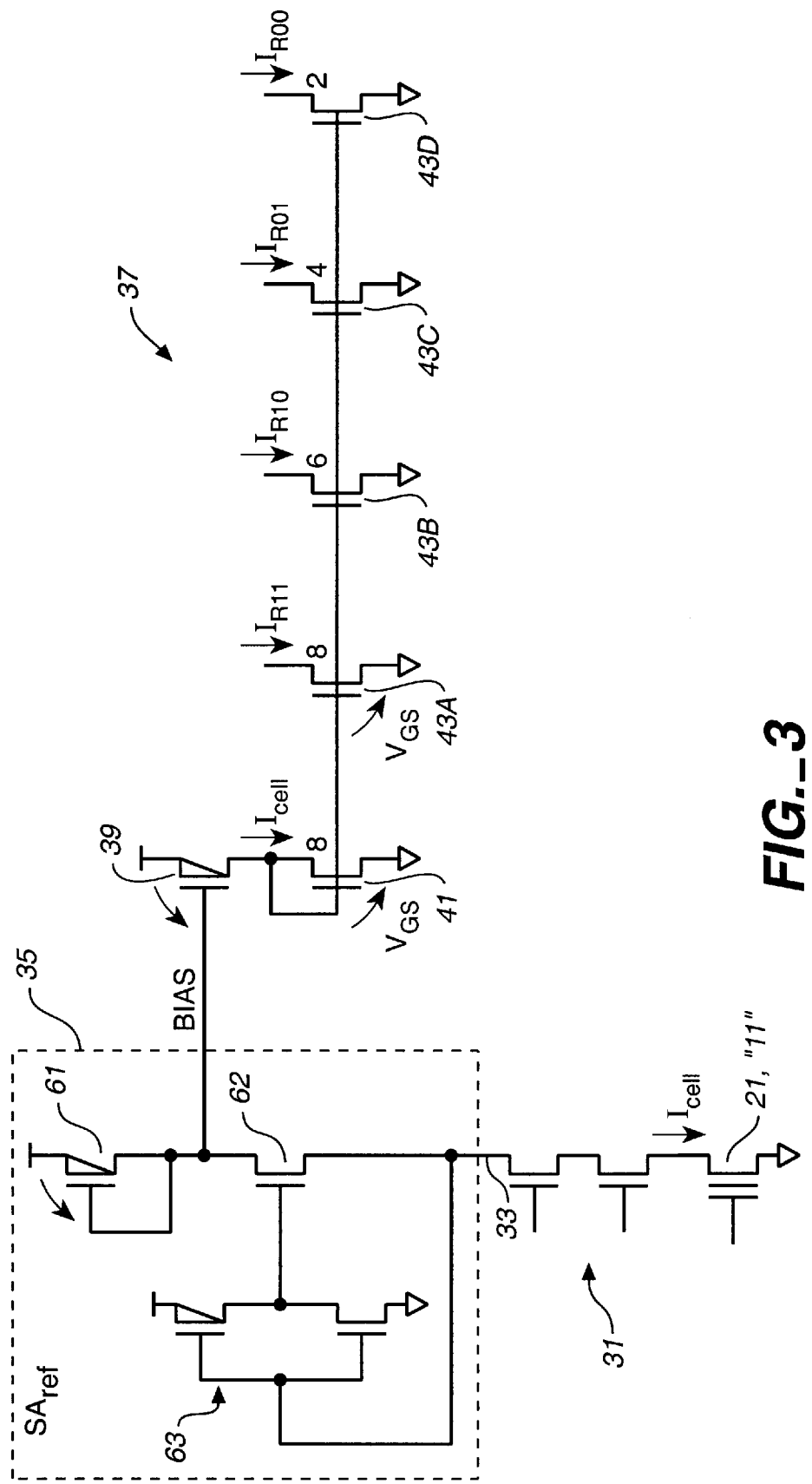
FIG._3

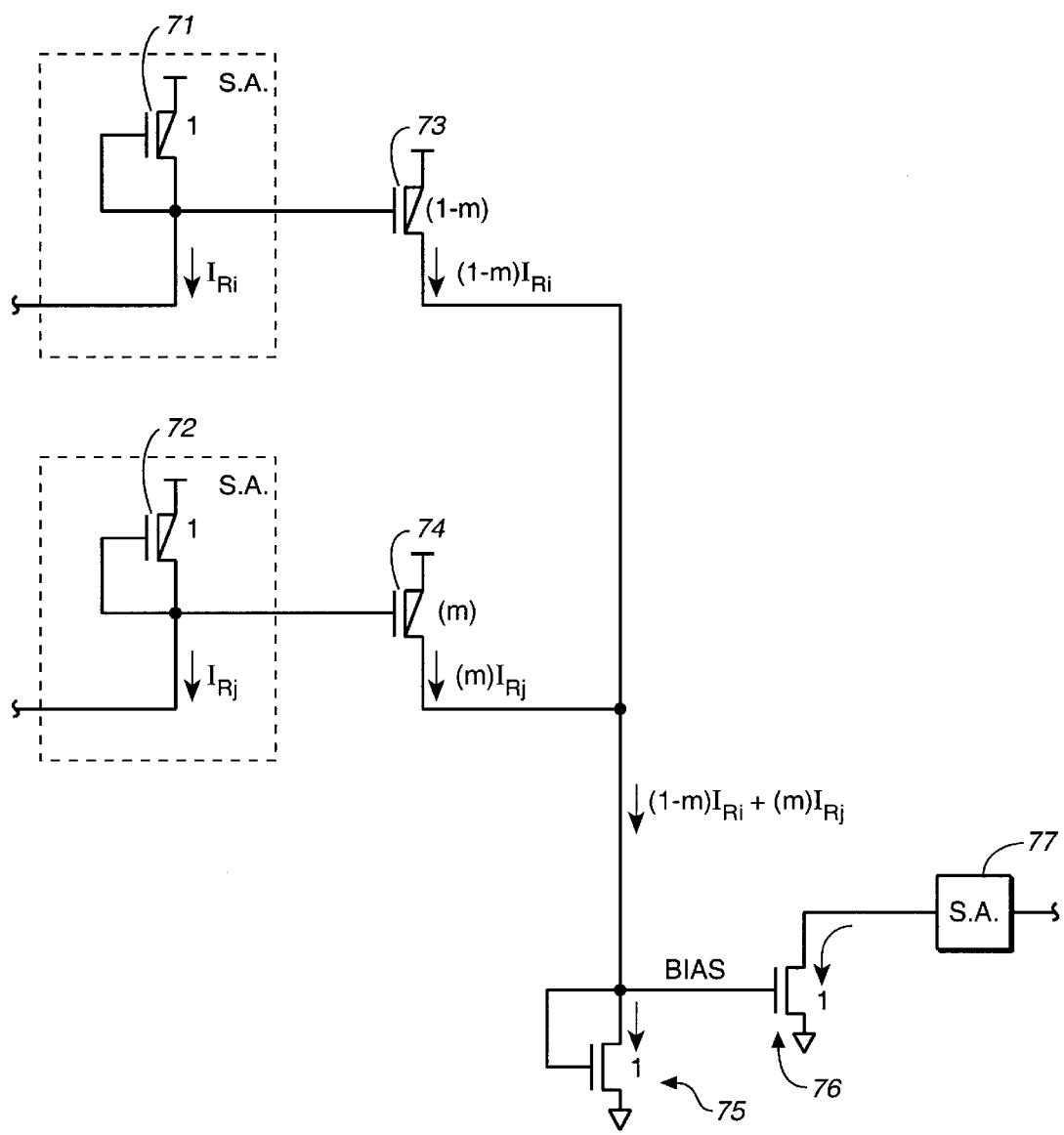
FIG._4

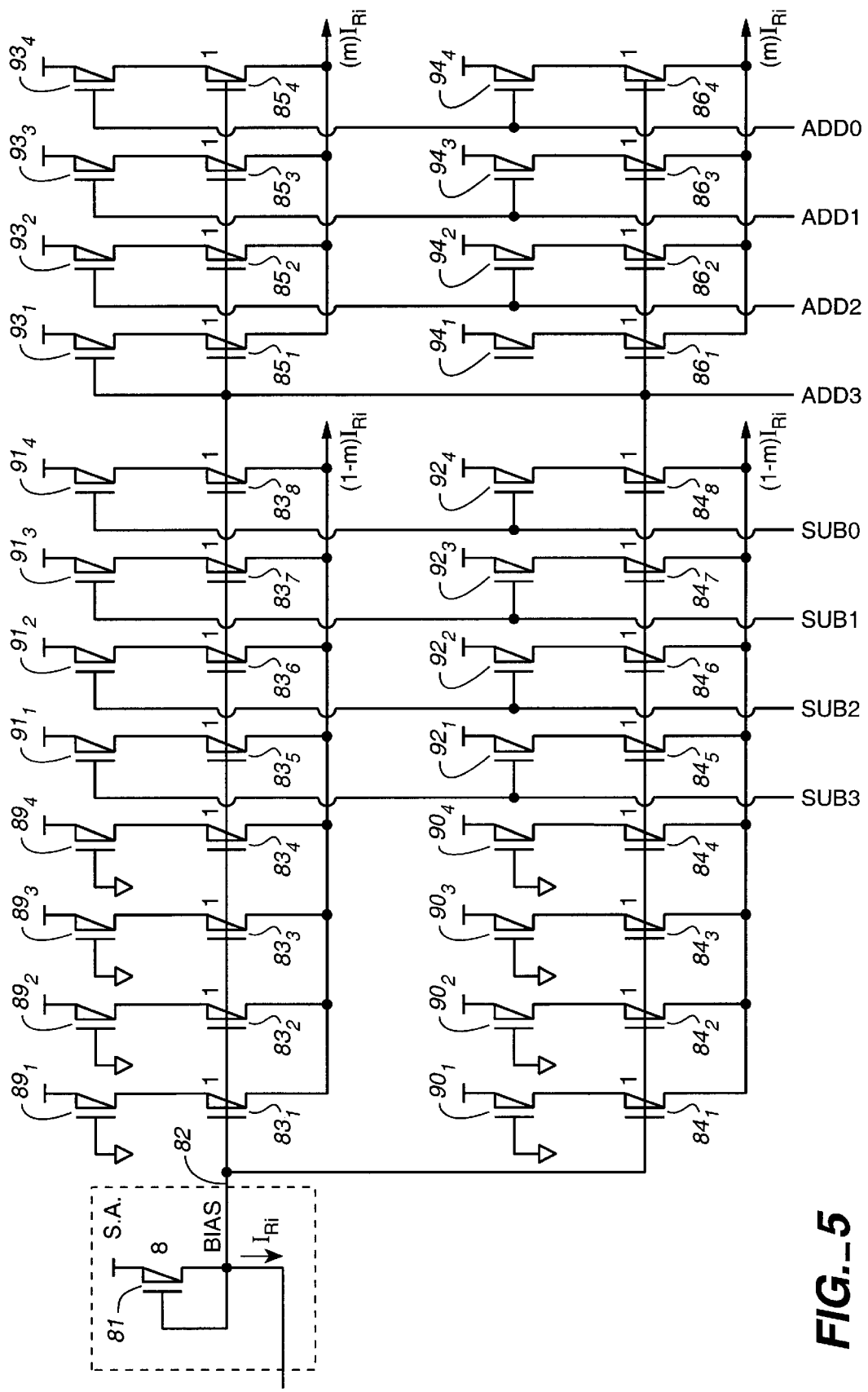

METHOD OF ESTABLISHING REFERENCE LEVELS FOR SENSING MULTILEVEL MEMORY CELL STATES

TECHNICAL FIELD

The present invention relates to semiconductor nonvolatile memory integrated circuits with multi-bit memory cells, each having more than two states defined by memory cell conduction threshold voltages and read-verify conduction currents. The invention relates in particular to methods of establishing the reference voltage or current levels that demarcate the different states for use in program verify operations and memory read operations.

BACKGROUND ART

The threshold voltage characteristic of an EPROM or flash EEPROM floating gate transistor structure is controlled by the amount of charge that is retained on its floating gate. That is, the minimum (threshold) amount of voltage that must be applied to the structure's control gate before the transistor can turn "on" to permit conduction between its source and drain regions is controlled by the level of charge on the floating gate.

The floating gate of a memory cell can retain any amount of charge within a range of charges, and therefore the memory cell can be programmed to exhibit a range of threshold voltage levels for conduction and a corresponding range of conduction current levels. Each memory cell can be caused to store more than one bit of data by partitioning its programmed charge into three or more ranges. Each cell is then programmed into one of those ranges.

In order to define multiple memory states, the memory system designates threshold windows corresponding to each of those states. Memory states representing n bits of data are demarcated using $2^n$ threshold windows. For example, if four ranges are used, two bits of data can be stored in a single cell. If eight ranges are used, three bits of data can be stored, 16 ranges permit storage of four data bits per cell, etc.

The amount of current flowing between a memory cell's source and drain is directly related to the threshold level of the addressed memory cell. To sense any one of these states, the control gate is raised to a read/verify gate voltage, for example $V_g$=+5V, the drain is biased to 0.5V–1.0V range, and the amount of source-drain conduction current $I_{ds}$ is sensed. Current sensing amplifiers attached to bit lines of the memory cell array are capable of distinguishing between the several conduction states by comparison with a set of corresponding reference currents.

A reference circuit generates a plurality of reference voltages or reference currents corresponding to the defined memory states. The reference values may be generated from a reference cell, which can be floating gate transistors identically constructed like the memory cells and pre-programmed to the desired thresholds of conduction. Reference values used in the prior art typically coincide with the boundaries between memory states.

During programming, a sequence of programming and verify pulses continues until the sensed current drops slightly below the reference current corresponding to the desired state. The reference currents for program verify operations may be somewhat shifted by a specified margin amount to place them closer to the midpoint between the boundaries for the adjacent lower and higher states. During read operations, the programmed state of a memory cell is sensed by comparing the conduction current with each of the reference currents corresponding to the different states.

An object of the present invention is to provide an improved means for generating reference currents for memory read, program verify and erase verify operations which are self-aligning.

DISCLOSURE OF THE INVENTION

The object is met by a method and circuit generating the read and program verify reference currents for a multi-bit nonvolatile memory cell array, in which both sets of current levels are defined from a set of reference current values establishing the center of the memory cell states. For a four level memory cell with states "00", "01", "10" and "11", four reference currents $I_{R00}$, $I_{R01}$, $I_{R10}$ and $I_{R11}$ are established by one or four programmed reference cells. In one embodiment, each of four reference cells are programmed to a different one of the four states and provide the four reference currents directly. In another embodiment a single reference cell programmed in the "11" state (the fully erased state with no floating gate charge, minimum threshold voltage and maximum read conduction current) is used to derive all four reference currents via a current mirror circuit. For cells with 8, 16 or other numbers of states, a corresponding number of reference currents are generated in analogous fashion.

For n memory states, (n−1) read current levels representing the boundaries between memory states are typically derived from the arithmetic average of the reference currents for adjacent states. Thus, a read boundary current $I_{i,i+1}$ between states i and i+1 is defined by the average of reference currents $I_{Ri}$ and $I_{Ri+1}$, i.e.:

$$I_{i,i+1}=(0.50)I_{Ri}+(0.50)I_{Ri+1}.$$

For a four state memory cell, the three read current levels $I_H$, $I_M$ and $I_L$ are defined by averaging adjacent pairs of the four reference currents $I_{R00}$, $I_{R01}$, $I_{R10}$ and $I_{R11}$ supplied by the reference memory cells. These averages are established using the same analog circuit described below that defines the program verify current levels, but with a margin value m set at substantially 50%. However, other margin values close to, but not exactly at, 50% might be used to define the read current levels representing the boundaries between memory states. That is, the established read currents may be somewhat above or below the average value, using a margin somewhere in a preferred range of between 40% and 60%.

The program verify current levels are also generated from adjacent reference currents using an analog circuit. Upper and lower current levels for the verify window are established for most states, except that a lower current level for the fully programmed state ("00" in a four level cell) is not needed. Also, the upper and lower current levels for the fully erased state ("11" in a four level cell) is optional, and is used only for verifying over-erase recovery operations. For a memory state i, the upper and lower verify levels $I_{iH}$ and $I_{iL}$ are defined as:

$$I_{iH}=(1-m)I_{Ri}+(m)IR_{i+1};$$

and $$I_{iL}=(1-m)I_{Ri}+(m)I_{Ri-1},$$

where m is the preset margin value for the programming operation. As there is no $I_{Ri+1}$ for i="11", the upper verify level $I_{11H}$ is defined as:

$$I_{11H}=(1+m)I_{R11}.$$

The margin value m in all cases is less than 50%, and is typically between 0.05 and 0.375, with values between 0.10 and 0.25 being preferred. The margin can differ for each program verify level. A user selectable margin may be provided. Current mirrors with selectable sizes can be used to provide the $(1-m)I_R$ and $(m)I_R$ current levels to be combined.

BRIEF DESCRIPTION OF THE DRAWINGS

FIG. 1 is a graph of memory cell conduction current levels $I_{SD}$ for respective reference, read and verify, with the read and verify current levels being generated in the present invention from the reference current levels.

FIG. 2 is a schematic circuit diagram of a circuit generating the reference current levels for a four state memory cell embodiment of the present invention.

FIG. 3 is a schematic circuit diagram of a detailed circuit portion of FIG. 2 for optionally generating the reference current levels from a single reference memory cell.

FIG. 4 is schematic circuit diagram illustrating a portion of the analog circuit block in FIG. 2 for generating the read and verify current levels from the supplied reference currents.

FIG. 5 is a schematic circuit diagram showing in further detail one element of the analog circuit block generating fractional currents of a supplied reference current with a selected margin value m for subsequent use according to the scheme of FIG. 4 in generating read and verify current levels.

BEST MODE OF CARRYING OUT THE INVENTION

With reference to FIG. 1, the reference, read and verify current levels for a four level memory cell array are shown. Current levels for memory cell arrays with 8, 16 or other numbers of memory cell states are analogous. Four reference current levels $I_R$ are provided, one for each memory state. These are designated $I_{R00}$, $I_{R01}$, $I_{R10}$ and $I_{R11}$ for the four memory states "00", "01", "10" and "11". State "11" typically corresponds to the fully erased state, state "00" to the fully programmed state, and "01" and "10" to intermediate states.

The fully erased state has the least charge (substantially zero) stored on the floating gate of the nonvolatile memory cell transistor structure, and has the lowest threshold voltage and largest conduction current of the four memory states. The fully programmed state has the most charge stored on the floating gate, and has the highest threshold voltage (often larger than the applied gate voltage during a read operation) and lowest conduction current (possibly zero) of the four states. The intermediate states have stored charge amounts that are between that of the fully erased and fully programmed states, and thus have intermediate threshold voltage and conduction current levels.

The reference current levels $I_{R00}$, $I_{R01}$, $I_{R10}$ and $I_{R11}$, are set by programmed reference memory cells at the center of the respective states, furthest from the read boundaries with adjacent states.

For a four state memory cell, three read boundaries exist between adjacent states. These are read current levels $I_L$, $I_M$ and $I_H$ (low, medium and high). $I_L$ is the boundary between adjacent memory states "00" and "01", $I_M$ is the boundary between adjacent memory states "01" and "10", and $I_H$ is the boundary between adjacent memory states "10" and "11". These boundary levels are preferably defined in the present invention as the arithmetic average between the corresponding adjacent states.

$$I_L=(0.50)I_{R00}+(0.50)I_{RR01};$$

$$I_M=(0.50)I_{R01}+(0.50)I_{R10};$$

and $$I_H=(0.50)I_{R10}+(0.50)I_{R11}.$$

Read current levels somewhat about or below those preferred values may be used, as the margin need not be exactly 0.50. However, a margin of substantially 50%, i.e. between about 40% and 60%, is generally desired. For example, if a margin of 45% is used, $IL=(0.55)I_{R00}+(0.045)I_{R01}$, etc. and the read currents will be slightly lower than it would be with an exactly 50% margin. (Also, the margins need not be exactly the same for all three state boundaries $I_L$, $I_M$, $I_H$.) During a typical memory cell read operation, sense amplifiers and a comparison circuit compare the conduction current of a selected memory cell with the respective read boundary current levels to establish which of the four states that memory cell is in. This read operation is not part of the present invention and can be done by any known method using the (n−1) boundary current levels supplied by the present invention to determine one of the n memory states for a selected multilevel memory cell.

A typical program operation consists of a sequence of short program and verify steps until a selected memory cell arrives at the desired programmed state. For programming, a margin value m is used to create windows 17 of allowable current values for each state. Regions 15 between the windows 17 are current levels that are forbidden as final program states. The forbidden zones 15 include the read boundary levels and a suitable margin to account for operational variations in memory cell conditions, such as temperature. Thus, in the present invention, upper and lower window levels are established for most memory states for the program verify operation. For the fully erased state "11", the upper and lower window levels are only used to verify over-erase recovery. For the-fully programmed state "00", a lower window level is not needed, as there is no over-programmed condition. Thus, a total of seven verify current levels $I_{11H}$, $I_{11L}$, $I_{10H}$, $I_{10L}$, $I_{01H}$, $I_{01L}$, and $I_{00H}$ are defined for the four memory states.

$$I_{11H}=(1+m)I_{R11};$$

$$I_{11L}=(1-m)I_{R11}+(m)I_{R10};$$

$$I_{10H}=(1-m)I_{R10}+(m)I_{R11};$$

$$I_{10L}=(1-m)I_{R10}+(m)I_{R01};$$

$$I_{01H}=(1-m)I_{R01}+(m)I_{R10};$$

$$I_{01L}=(1-m)I_{R01}+(m)I_{R00};$$

and $$I_{00H}=(1-m)I_{R00}+(m)I_{R01}.$$

The margin value(s) m is less than the margin used to define the read boundaries (less than 50%, i.e. less than 0.5 if the preferred read margin of 50% is used for $I_L$, $I_M$ and $I_H$), and is typically between 0.05 and 0.375. Values between 0.10 and 0.25 are preferred. Smaller margin values m (with smaller allowed program windows 17 and larger forbidden zones 15) are preferred when large operational variations are expected, whereas most often a value of about 0.25 will be adequate. A preferred embodiment of the analog circuit block used in the present invention for establishing the verify levels allows any of the values 0.125, 0.25, or 0.375 to be selected for the margin m. The margin value can differ for the different states.

With reference to FIG. 2, the reference currents $I_{R00}$, $I_{R01}$, $I_{R10}$ and $I_{R11}$ are generated using reference memory cells in a reference array 21. There are different options, including using a single reference cell to generate all reference currents and using a separate reference cell to generate each of the reference currents. (An intermediate option where two or more cells generate multiple reference currents is also possible, especially where there are 8 or more states.) Where separate cells generate the several reference currents, these currents are supplied by the reference memory cells along lines 23A–23D through switches 25 to the reference current output lines 27A–27D and then to sense amplifiers 51 associated with an analog circuit block 53. The reference memory cells are pre-programmed by the manufacturer to the respective states "11", "10", "01" and "00". These define the center of each state's read and program window.

When a reference memory cell is used to generate multiple reference currents, including the case where a single reference memory cell generates all of the reference currents for all of the states to be defined, the current conducted by that reference memory cell is supplied over an alternative line 33 to a reference sense amplifier 35 to produce a BIAS voltage for a current mirror circuit 37. For a four state per cell memory, the single reference memory cell corresponds to the fully erased "11" state (minimum floating gate charge, minimum threshold voltage, maximum conduction current). The various reference currents produced by the current mirror circuit 37 are supplied on lines 45A–45D through a set of switches 47 to the reference current output lines 27A–27D and then to the sense amplifiers 51 associated with the aforementioned analog circuit block 53. Only one set of switches 25 and 47 are set to pass current to the sense amplifiers 51, as determined by whether one or all reference memory cells are used to generate the reference currents.

With reference to both FIGS. 2 and 3, the reference sense amplifier 35 and current mirror circuit 37 generate reference currents for multiple memory states from a single reference memory cell of state "11" in the reference array 21. The cell conduction current $I_{cell}$ flows, through y-select pass transistors 31, along line 33 from the sense amplifier 35 to that reference memory cell. A typical sense amplifier can include a diode-connected p-channel transistor 61, an n-channel transistor, and an inverter 63, connected to the reference memory cell 21, "11" so that the current $I_{cell}$ produces a BIAS voltage at the node between the p-channel and n-channel transistors 61 and 62, with the BIAS voltage creating a mirror current $I_{cell}$ through p-channel pull-up transistor 39 (because both transistors 61 and 39 have the same drain-to-gate voltage drop). A diode-connected n-channel transistor 41 connected between the transistor 39 and ground has a gate-to-source voltage drop $V_{GS}$ determined by the mirror current $I_{cell}$ conducted through transistor 41. This voltage drop $V_{GS}$ is applied to the gates of four other n-channel transistors 43A–43D. The transistor 41 has a specific channel size (for convenience represented by the numeral 8). Transistors 43A–43D have different channel sizes, at most one (but not necessarily any) of which may be the same size as transistor 41 (here represented by numerals 8, 6, 4 and 2). The same applied voltage drop VGS generates different currents proportional to their channel sizes. In the example used here, conduction current $I_{R11}$ through transistor 43A of size 8 (equal in this example to the channel size of transistor 41) is equal to $I_{cell}$. Conduction current $I_{R10}$ through transistor 43B of channel size 6 is ¾ $I_{cell}$. Conduction current $I_{R01}$ through transistor 43C of channel size 4 is ½ $I_{cell}$. Finally, conduction current $I_{R00}$ through transistor 43D of size 2 is ¼ $I_{cell}$. The resulting conduction currents $I_{R11}$, $I_{R10}$, $I_{R01}$ and $I_{R00}$ are placed on lines 45A–45D as previously mentioned. These sizes and current values are representative, and can be selected by manufacturing transistors 43A–43D of any desired set of sizes. The reference currents need not have a linear relationship. Indeed, it might be desired to have the separation between $I_{R11}$ and $I_{R10}$ greater than the separation between other reference currents due to the rapidity at which charge is initially injected into fully erased memory floating gates compared to the slower injection of partially charged floating gates. In that case the relative sizes of transistors 43A–43D might be approximately 8, 5, 3 and 1.

With reference to FIG. 4, for any given reference current $I_{Ri}$, a fractional current $(1-m)I_{Ri}$ for some margin value m can be produced using a current mirror technique like that used to generate multiple reference currents from a single current in FIGS. 2 and 3 above. Likewise, for any given reference current $I_{Rj}$, a fractional current $(m)I_{Rj}$ can also be produced. In this technique the diode-connected p-channel transistors 71 and 72 of a first channel size (designated by numeral 1) produce a voltage drop dependent upon the input reference current $I_{Ri}$ or $I_{Rj}$. P-channel transistors 73 and 74 have their gates connected to the gate-source of respective transistors 71 and 72. Transistors 73 and 74 have respective channel sizes of $(1-m)$ and $(m)$ relative to that of transistors 71 and 72. With the same drain-gate voltage drop across transistors 73 and 74 as across corresponding transistors 71 and 72, the transistors 73 and 74 conduct respective $(1-m)I_{Ri}$ and $(m)I_{Rj}$ currents. These currents can be combined with a simple connection to generate a current $(1-m)I_{Ri}+(m)I_{Rj}$. This combined current can likewise be sensed, using a current mirror and sense amplifier elements 75–77 whose operation is like that described above for elements 35 and 39 in FIG. 3. The resulting current output may then compared during a read or verify step with the current from an addressed memory cell. For reads, m=0.5, while for program verify operations m<0.5 (FIG. 5 shows a preferred embodiment that allows a user to select m from any of 0.125, 0.25, 0.375 or 0.5, with the latter used only during read operations.) Also for verify, the lower bound of the allowed current of a state uses j=i−1. As previously discussed, there is no lower current boundary for the fully programmed "00" state. The upper bound of the allowed current of a state during a program verify operation uses j=i+1, except for the fully erased state "11". For the fully erased state "11", $I_{11H}=(1+m)I_{R11}$ is generated by summing three currents, $(1-m)I_{R11}$, $(m)I_{R11}$ and again $(m)I_{R11}$.

With reference to FIG. 5, one element of the analog circuit block 53 of FIG. 2 receives a reference current $I_{Ri}$ for a state i and generates fractional currents $(1-m)I_{Ri}$ and $(m)I_{Ri}$ for a selected margin value m for use as in FIG. 4 to generate the read and verify currents set forth in FIG. 1 as defined above. The element shown in FIG. 5 is repeated so that each of the reference currents $I_{R11}$, $I_{R10}$, $I_{R01}$ and $I_{R00}$ has its own fractional current generating element. A single set of fractional currents $(1-m)I_{R00}$ and $(m)I_{R00}$ is needed from reference current $I_{R00}$. Two of each of the fractional currents $(1-m)I_{R01}$, $(m)I_{R01}$, $(1-m)I_{R10}$, $(m)I_{R10}$, and $(1-m)I_{R11}$ are needed to be generated from the reference currents $I_{R01}$, $I_{R10}$ and $I_{R11}$. Three sets of the fractional current $(m)I_{R11}$ are needed, one for use in the verify current $I_{11L}$ and two for use in the verify current $I_{11H}$ in order to get $(1+m)I_{R11}$. Since read and verify current levels are never needed at the same time, the read current levels $I_H$, $I_M$ and $I_L$ can share the same circuit elements as that used to generate the verify levels without additional overhead. The margin value m is merely switched to 0.50 when a read operation is indicated.

In FIG. 5, a sense amplifier including a diode-connected p-channel transistor 81 conducts the supplied reference current $I_{Ri}$ and generates a drain-gate voltage drop and a corresponding BIAS voltage on line 82 that drives the gates of transistors $83_1$–$83_8$, $84_1$–$84_8$, $85_1$–$85_4$ and $86_1$–$86_4$. The transistor 81 has a channel size, represented here by the numeral 8, that corresponds to the denominator of the fraction for the generated fractional currents. Each of the two dozen other transistors 83–86 has a channel size, represented by the numeral one, that has in this example one-eighth of the current conduction $I_{Ri}$ of the sense amplifier's transistor 81. The p-channel sources of each set of transistors $83_1$–$83_8$, $84_1$–$84_8$, $85_1$–$85_4$ and $86_1$–$86_4$ are connected to generate a cumulative fractional current $(1-m)I_{Ri}$ or $(m)I_{Ri}$ according to the number of active transistors in a particular set, where m is either ⅛, ⅖, ⅜ or ⅘ in this example. A set of transistors $91_1$–$91_4$, $92_1$–$92_4$, $93_1$–$93_4$ and $94_1$–$94_4$ serve as switches that selectively connect or disconnect certain transistors $83_5$–$83_8$, $84_5$–$84_8$, $85_1$–$85_4$, and $86_1$–$86_4$ to the power supply line. These switches are controlled by control signals ADD0–ADD3 and SUB0–SUB3 provided to their transistors. Additional transistors $89_1$–$89_4$ and $90_1$–$90_4$ are provided for symmetry so that all paths contributing to the current output are identical, but these additional transistors have their gates tied to ground instead of receiving control signals. ADD0–ADD3 control the switches $93_1$–$93_4$ and $94_1$–$94_4$ in the opposite manner from the corresponding SUB0–SUB3 control signals' control of switches $91_1$–$91_4$ and $92_1$–$92_4$. Thus, when only four transistors $83_1$–$83_4$ are active in the first set for $(1-m)=⅘$, all four transistors $85_1$–$85_4$ in the corresponding set will be active for m=⅘; when five transistors $83_1$–$83_5$ are active for $(1-m)=⅝$, only three transistors $85_2$–$85_4$ will be active for m=⅜; etc. This ensures that $(1-m)+m=1$ in actual implementation. The fractional currents are then combined as discussed above with reference to FIG. 4. The second bank of transistors in FIG. 5, $84_1$–$84_8$, $86_1$–$86_4$, $92_1$–$92_4$, and $94_1$–$94_4$, is not needed for reference current $I_{R00}$, as only one set of fractional currents is needed.

For reference current $I_{R11}$, the fractional current generating circuit element in FIG. 5, may be modified to include a third partial bank driven by the BIAS voltage and controlled by ADD0–ADD3 in a manner like transistors $85_1$–$85_4$ and $86_1$–$86_4$. This modification provides three fractional current versions of $(m)I_{R11}$, needed to produce $I_{11H}=(1+m)I_{R11}=(1-m)I_{R11}+(m)I_{R11}+(m)I_{R11}$. Alternatively, the fractional current generating circuit element in FIG. 5 can be modified so that control signals SUB0–SUB3 may be independently supplied to the two banks (rows) of transistors, whereby in the (erase) verify mode of operation, the transistors $83_1$–$83_8$ supply $(1)I_{R11}$ (here i="11") instead of $(1-m)I_{R11}$, while transistors $84_1$–$84_8$ still provide current $(1-m)I_{R11}$. This enables the current level $I_{11H}=(1+m)I_{R11}=(1)I_{R11}+(m)I_{R11}$ to be provided by the first bank or row of the circuit, while $I_{11L}$ and $I_{10L}$ are still supplied with the current contributions $(1-m)I_{R11}$ and $(m)I_{R11}$, respectively, from the second or row of that circuit.

All of the reference currents for read and verify are generated by the present invention from one or more reference memory cells, as just described. These read and verify reference currents may be used in the usual manner to determine memory cell states of addressed cells by comparison.

What is claimed is:

1. A circuit generating reference current levels for more than two memory cell states, comprising:
   a first reference memory cell pre-programmed to provide a first reference current defining a center of a first memory cell state within a range of current levels corresponding to said first memory cell state;
   means for providing two or more additional reference currents defining centers of additional memory cell states within distinct ranges of current levels for those additional states; and
   an analog circuit block using said reference currents to generate a set of inter-state boundary current levels for read and program verify memory operations, said analog circuit block summing fractional currents of adjacent reference currents to generate said inter-state boundary current levels, said fractional currents being substantially 50% of said reference currents for generating read boundary current levels, said fractional currents being $(1-m)$ and m of said reference currents for generating verify boundary current levels, where m is a specified margin value less than the fraction used to define the read boundary current levels.

2. The circuit of claim 1 wherein said means for providing said additional reference currents are additional pre-programmed reference memory cells.

3. The circuit of claim 1 wherein said means for providing said additional reference currents comprises a current mirror circuit generating said additional reference currents as specified proportions of said first reference current.

4. The circuit of claim 3 wherein said current mirror circuit includes a set of transistors biased by a sense amplifier for said first reference memory cell, the set of transistors having channel sizes selected to conduct different amounts of current in proportion to said first reference current.

5. The circuit of claim 1 wherein the analog circuit block also generates an over-erase upper current level from one of the reference currents corresponding to an erased memory state, said over-erase upper current level being established as the sum of said erased state reference current plus a fraction m thereof, where m is a selected margin value.

6. The circuit of claim 1 wherein the analog circuit block comprises a set of sense amplifiers for said reference currents and at least one pair of current mirrors for each sense amplifier, each pair of current mirrors connected so as to be biased by its sense amplifier, the pair of current mirrors having channel sizes selected such that the conducted currents are respectively fractions $(1-m)$ and m of the reference current conducted by its corresponding sense amplifier, fractional currents $(1-m)I_{Ri}$ and $(m)I_{Rj}$ for reference currents $I_{Ri}$ and $I_{Rj}$ of adjacent memory states i and j being summed in said analog circuit block to provide said boundary current levels.

7. The circuit of claim 6 wherein the pairs of current mirrors comprise multiple transistors connected in parallel, with gates all biased by their corresponding sense amplifier, the current mirrors also having a set of switches selectively connecting a specified number of the multiple transistors to a power supply voltage, each transistor having a channel size that is a fraction 1/n of the sense amplifier channel size, where n is the total number of active transistors in both current mirrors of the pair.

8. The circuit of claim 1 wherein the number of memory states is four, and there are four reference currents.

9. The circuit of claim 8 wherein there are three read boundary current levels $I_H$, $I_M$ and $I_L$ defined by the analog circuit block as:

$$I_H = (0.50)I_{R11} + (0.50)I_{R10};$$

$$I_M = (0.50)I_{R10} + (0.50)I_{R01};$$

and $$I_L = (0.50)I_{R01} + (0.50)I_{R00},$$

where $I_{R11}$, $I_{R10}$, $I_{R01}$, and $I_{R00}$ are the reference currents for memory states "11", "10", "01" and "00" respectively.

10. The circuit of claim 8 wherein there are seven verify boundary current levels defined by the analog circuit block as:

$$I_{11H} = (1+m)I_{R11} \text{ (an over-erase upper current level)};$$

$$I_{11L} = (1-m)I_{R11} + (m)I_{R10};$$

$$I_{10H} = (1-m)I_{R10} + (m)I_{R11};$$

$$I_{10L} = (1-m)I_{R10} + (m)I_{R01};$$

$$I_{01H} = (1-m)I_{R01} + (m)I_{R10};$$

$$I_{01L} = (1-m)I_{R01} + (m)I_{R00};$$

and $$I_{00H} = (1-m)I_{R00} + (m)I_{R01},$$

where m is a specified margin value less than 0.50.

11. The circuit of claim 10 wherein the margin value is between 0.05 and 0.375.

12. The circuit of claim 10 wherein the margin value is a variable not necessarily identical for all verify boundary current levels.

13. The circuit of claim 1 wherein the number of memory cell states is greater than four and there are an equal number of reference currents defining the center of each state.

14. A method of establishing reference current levels for sensing more than two memory cell states, comprising:
   providing a set of reference currents, one reference current for each memory cell state, the reference currents defining centers of the memory cell states within distinct ranges of current levels for each state; and
   using said reference currents to generate a set of inter-state boundary current levels for read and program verify memory operations, said boundary current levels being generated by producing fractional currents that are (1−m) and m of the set of reference currents, where m is a specified margin value that is substantially 50% for read boundary current levels and less than the read margin value for verify boundary current levels, fractional currents of adjacent reference currents being summed to generate the inter-state boundary current levels.

15. The method of claim 14 wherein said set of reference currents are provided by a corresponding set of preprogrammed reference memory cells.

16. The method of claim 14 wherein said set of reference currents are provided by a first pre-programmed reference memory cell conducting a first reference current, and a current mirror circuit generating additional reference currents as specified proportions of said first reference current.

17. The method of claim 14 wherein one of said reference currents corresponding to an erased memory state is also used to generate an over-erase upper current level as the sum of that reference current and a fraction m thereof, wherein m is a selected margin value less than 50%.

18. The method of claim 14 wherein the fractional currents are generated by a set of sense amplifiers for the reference currents and at least one pair of current mirrors for each sense amplifier, the current mirrors being biased by their corresponding sense amplifier, each pair of current mirrors having channel sizes selected to conduct the respective fractions (1−m) and m of the reference current conducted by its corresponding sense amplifier.

19. The method of claim 18 wherein the current mirrors comprise multiple transistors connected in parallel with their gates biased by their corresponding sense amplifier, and a set of switches selectively connecting multiple transistors to a power supply voltage, whereby the margin value m can be selected according to the number of active transistors in each current mirror.

20. The method of claim 19 the margin value is switched between 0.50 for read operations and a value less than 0.50 for verify operations.

* * * * *